United States Patent [19]

Kyrian

[11] 4,449,103
[45] May 15, 1984

[54] HIGH POWER CLASS B MODULATION AMPLIFIER FOR A BROADCAST TRANSMITTER

[75] Inventor: Bohumil Kyrian, Windisch, Switzerland

[73] Assignee: BBC Brown, Boveri & Company, Limited, Baden, Switzerland

[21] Appl. No.: 327,588

[22] Filed: Dec. 4, 1981

[30] Foreign Application Priority Data

Dec. 12, 1980 [CH] Switzerland ............... 9173/80

[51] Int. Cl.³ ........................................... H03F 3/26
[52] U.S. Cl. .......................... 330/123; 330/202; 330/297; 332/59; 455/108; 455/127
[58] Field of Search ............ 330/123, 129, 202, 136, 330/297; 332/38, 59; 455/108, 127

[56] References Cited

U.S. PATENT DOCUMENTS 4,054,843 10/1977 Hamada ............... 330/297 X
4,186,346 1/1980 Wysocki ............... 455/108

FOREIGN PATENT DOCUMENTS 5144857 4/1976 Japan ............... 330/297

*Primary Examiner*—James B. Mullins
*Attorney, Agent, or Firm*—Oblon, Fisher, Spivak, McClelland & Maier

[57] ABSTRACT

A method for amplifying electric signals, an amplifier circuit and application of this amplifier circuit as the modulator stage of a subsequent amplifier, employing a variable anode voltage for the purpose of improving the efficiency of amplifiers and particularly of high-power modulation amplifiers which are used, for example, in broadcast transmitters for the amplitude modulation of the radio-frequency output stage. From the modulation signal to be amplified, a control signal is derived in a control stage, this control signal being associated with the amplitude of the envelope of this modulation signal and being used for controlling the output voltage of a modulator/rectifier. The control signal is caused to follow the modulation signal within a presettable response time.

6 Claims, 6 Drawing Figures

HIGH POWER CLASS B MODULATION AMPLIFIER FOR A BROADCAST TRANSMITTER

BACKGROUND OF THE INVENTION

1. Field of the Invention

This invention relates to a method for amplifying electric signals, an amplifier circuit and an application of this amplifier circuit as the modulator stage of a subsequent amplifier. This invention particularly relates to the amplification of low frequency modulation signals of a broadcast transmitter.

2. Description of the Prior Art

In an amplifier and in particular in a modulator amplifier for high output power, the direct-current power supplied must be converted into output power with the highest possible efficiency. With very high output powers, push-pull amplifiers are used in so-called class B or class C modes of operation almost without exception. Theoretically, the efficiency of class B operation is 78.5%. With class B low-frequency amplifiers efficiencies of around 70% are achieved in practice. The additional losses are caused by the residual voltage and the quiescent current in the output stages.

If the modulation factor m of an amplitude modulated high-frequency oscillation drops below 1, which is the case where modulation is effected by means of music and speech, the achievable efficiency is much lower still. With low modulation factors down to approximately m=0.4 which are typical with broadcast program modulation, the losses are relatively high with respect to the power output; the efficiency of a modulator with a class B amplifier is then around 27%.

Since the low-frequency power $P_{mod}$ output of a modulation amplifier is proportional to the square of the modulation factor, $P_{mod}=P_t\, m^2/2$, where $P_T$=carrier power, the losses become noticeable with the typical modulation factors and the total efficiency of a transmitter drops rapidly within the range of m=0 to m=0.6.

A class B anode modulator which can be used for large transmitters is known, for example, from Eugen Philippow, Taschenbuch Elektrotechnik, Volume 3, VEB Verlag Technik, Berlin 1978, page 721, in which modulator the modulation voltage is superimposed on the direct anode voltage for the power output stage. The amplitude of the alternating output voltage available at the antenna output is then nearly proportional to the anode voltage. The modulation voltage is provided by a modulation amplifier operated in push-pull class B mode via a modulation transformer. In this arrangement the center tap of the primary winding and one end of the secondary winding of this modulation transformer are at a constant anode potential. One disadvantage of this class B anode modulator consists in high losses occurring with a low modulation factor since the modulation amplifier is always supplied with the full anode voltage.

In German Offenlegungsschrift No. 2,342,714 a grid modulation circuit for radio transmitters is disclosed in which the anode voltage of the output stage of a radio transmitter is altered in synchronism with the change in the average power of a modulation signal. Simultaneously, a control signal is derived from a modulator, which is connected via a driver stage to control this output stage, for a controllable rectifier, at the output of which the altered anode voltage is available.

SUMMARY OF THE INVENTION

Accordingly, one object of this invention is to provide a novel amplification method and amplifier having improved efficiency in the amplification of low-frequency electric signals.

This and other objects are achieved according to the invention by providing a novel method and amplifier for amplifying electric signals of a broadcast transmitter, wherein the modulation signal to the amplifier is fed to the control or modulation input of an amplifier stage; a control signal ($U_{St}$) is derived from the electric signal or modulation signal ($U_{mod}$) to be amplified, this control signal corresponding to the envelope of this electric signal; the amplifier or variable anode voltage ($U_{a1}$) of this amplifier stage is controlled as a function of this control signal; and this control signal is caused to follow the amplitude of the envelope of the modulation signal in at least one direction of change within a presettable response time.

An advantage of the invention consists in the fact that energy can be saved when operating a low-frequency amplifier. This saving gains significance in particular for continuously operated high-power amplifiers. The effort required for this saving is comparatively small since conventional circuits can be used for implementing the invention.

If the anode voltage is continuously adapted to the instantaneous amplitude of the modulation voltage, the efficiency of the amplifier or modulator, respectively, can be increased in such a manner that in the case of broadcast program modulation of an AM transmitter a total efficiency is achieved which is superior to that of a pulse-duration modulated (PDM) transmitter.

In accordance with special developments of the invention, dynamic distortion occurring with an abrupt change in the amplitude of the input signal can be kept small by causing the variable anode voltage of the amplifier to follow a rise in this amplitude of the input signal rapidly and to follow a drop slowly. In the range of modulation factors of up to about m=0.5, predominantly used in the practical operation of broadcast transmitters, dynamic distortion can be totally avoided by keeping the anode voltage constant up to an initial value which corresponds to this presettable modulation factor and causing the amplitude of the modulation signal to follow proportionally only for higher values of the modulation factor. The total efficiency of a transmitter can thus be kept at very high values to a modulation depth of about 50% and begins to drop to a greater extent only above this modulation factor. With the range of the variable anode voltage, dynamic distortion can be eliminated by using a delay section in the feed of the modulation signal to the control input of the amplifier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
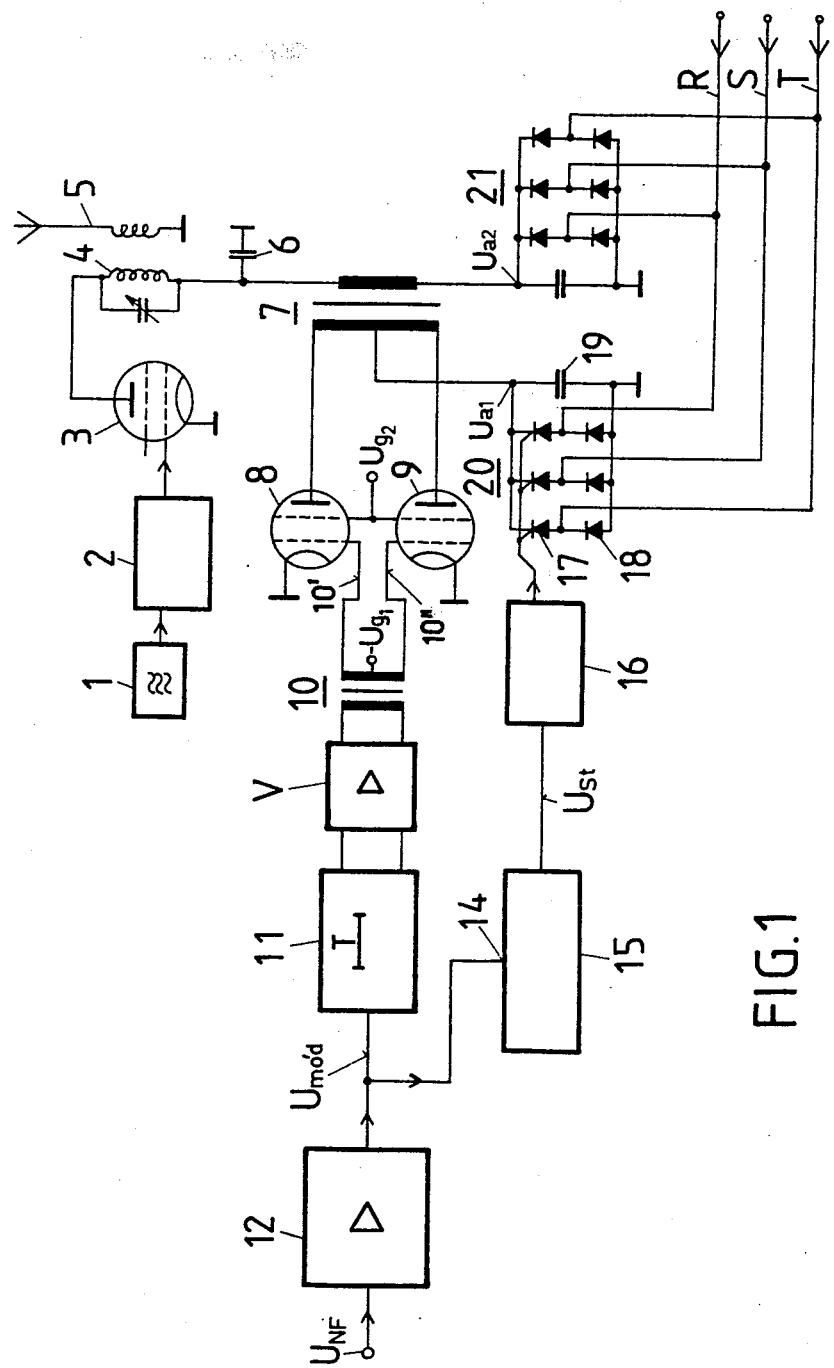
FIG. 1 is a block diagram a class B anode modulator with a variable modulator anode voltage.

Referring now to the drawings, wherein like reference numerals designate identical or corresponding parts throughout the several views, and more particularly to FIG. 1 thereof, there is shown an amplitude modulator with variable anode voltage which, at its output, modulates the anode voltage of the radio-frequency output stage of a broadcast transmitter via a modulation transformer 7. This radio-frequency output stage is provided with a tetrode 3 which is used as a power or output amplifier and which is controlled by an oscillator 1 via a radio-frequency driver stage 2. The anode of this tetrode 3 is connected via a tuned radio-frequency circuit 4 which transfers the transmission power to an antenna 5 and via the secondary winding of a modulation transformer 7 to a constant voltage source or a main rectifier 21, at the output of which the voltage $U_{a2}$ appears. A filter capacitor 6 is connected between the output of the tuned radio-frequency circuit 4 to the secondary winding of the modulation transformer 7 and ground, the function of this filter capacitor being to prevent transfer of the carrier-frequency oscillation from the radio-frequency output stage to the amplitude modulator.

The amplitude modulator or the modulator stage used for modulating the anode voltage of the radio-frequency output stage of a transmitter is provided with push-pull connected class B amplifiers or tetrodes 8 and 9, which have screen grids to which a voltage $U_{g2}$ is applied and the control grids of which are connected to the outputs 10' and 10" of the secondary winding of a low-frequency driver transformer 10. The constant voltage $-U_{g1}$ is applied to the center tap of the secondary winding of this low-frequency driver transformer. The primary winding of this low-frequency driver transformer is connected via an amplifier V to the output of a delay section 11 which delays a modulation signal $U_{mod}$ fed to the input of this delay section by a presettable period T. This modulation signal is a low-frequency signal $U_{NF}$ which has already been amplified in a low-frequency preamplifier 12 and which is fed to the input of this preamplifier.

The modulation signal $U_{mod}$ is fed to the input 14 of a variable-voltage control unit or a control stage 15, the output of which supplies a control signal $U_{St}$ to a thyristor control device 16. In the control stage 15 the amount of envelope of the electric signals to be amplified in the modulator stage is formed.

The output signal of the thyristor control device 16 is fed to the control input of thyristors 17 which are arranged in a three-phase bridge circuit with diodes 18 and form the modulator rectifier 20. From the output of this rectifier the amplifier voltage or variable anode voltage $U_{a1}$ for the anodes of the two tetrodes 8, 9 is fed to the center tap of the primary winding of the modulation transformer 7. A capacitor 19 which is connected in parallel to the rectifier circuit and is grounded on one side is used for smoothing this variable anode voltage. The three-phase voltage for the main and modulator rectifiers comes via the phase lines called R, S and T from an anode transformer which is not shown.

Figure 2:
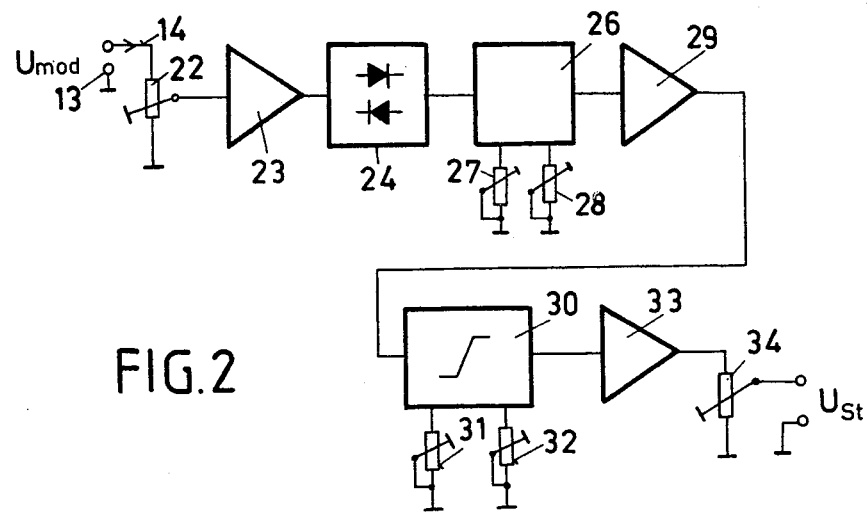
FIG. 2 is a block diagram of the variable-voltage control unit 15 of FIG. 1.

FIG. 2 shows a block diagram of this control stage 15. The modulation signal $U_{mod}$, which is supplied to the input 14 and has an amplitude of for example 1 volt RMS, is fed via a potentiometer 22 and an amplifier 23, to a rectifier 24 having an adjustable rectifier bias voltage within the range from 0.2–0.6 of the nominal rectifier voltage and rectified. The input terminal 13 is grounded. The rectified modulation signal is fed via a conventional timing element 26, an amplifier 29, conventional limiter 30 and a further amplifier 33 to a potentiometer 34 which is grounded on one side and to the tap of which the control signal $U_{St}$ is applied. The timing element 26 is connected to a potentiometer 27 with a grounded tap for adjusting a presettable rise time $t_A$ of, for example, 1 ms to 10 ms and to a potentiometer 28, also with a grounded tap, for adjusting a presettable decay time $t_B$ within the range of 0.5 s–10 s and particularly $\leq 3$ s of a pulse response signal or output signal of this timing element with respect to its input signal, see FIG. 5. The limiter 30 is connected to potentiometers 31 and 32. The potentiometer 31 is used for adjusting a presettable maximum value in accordance with a range of m=0.9–1.1 of the control signal $U_{St}$ present at the output of the control stage 15 and the potentiometer 32 is used for setting a minimum value of $U_{St}$ in accordance with a range of m=0.2–0.6.

The method according to the invention or the effect of the amplifier circuit, respectively, is now explained with the aid of FIGS. 1–6.

The low-frequency signal $U_{NF}$ to be amplified is first amplified in the low-frequency pre-amplifier 12 and supplied as a modulation signal $U_{mod}$ via a low-frequency driver provided with a delay section 11, an amplifier V and a low-frequency driver transformer, to the control grids of push-pull operated tetrodes 8 and 9. The amplitude low-frequency signal is decoupled via the modulation transformer 7, the primary winding of which has supplied to it the variable anode voltage $U_{a1}$ for the two tetrodes and the secondary winding of which is located in the anode circuit with constant anode voltage $U_{a2}$ of the radio-frequency output stage 3 of a broadcast transmitter. From the modulation signal $U_{mod}$ a control signal $U_{St}$ is derived in the control stage 15, this control signal corresponding to the amplitude of the envelope of the modulation signal and being used for controlling the variable anode voltage $U_{a1}$. This variable anode voltage can thus be amplified proportionally to the modulation factor m. For modulation factors $m \geq 1$, the full nominal voltage of the modulator rectifier is present at the primary winding of the modulation transformer and for a modulation factor of m=0 the variable voltage 0 is present, if no minimum voltage is preset, see the dot-dashed continuation of the straight portion of the fully drawn curve within the range of low values of m in FIG. 3. This makes it impossible for anode losses to occur in the low-frequency modulator without modulation.

Figure 3:
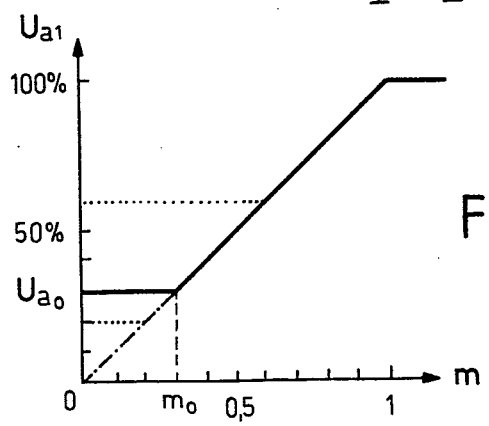
FIG. 3 is a graph illustrating the characteristic of the anode voltage $U_{a1}$ of a modulator according to FIG. 1 as a function of the modulation factor m.

The curve, drawn as a continuous line, in FIG. 3 ashows the characteristic of the variable anode voltage $U_{a1}$ at the output of the modulator rectifier 20 as a function of the modulation factor m which is associated with the modulation voltage $U_{mod}$ or the control voltage $U_{St}$, respectively, in accordance with preferred mode of operation of the low-frequency modulator. The variable anode voltage is plotted in percent of nominal anode voltage. Up to an initial modulation factor $m_0$, which is presettable by means of the potentiometer 32, see FIG. 2, of for example 0.3, the voltage at the output of the modulator rectifier 20 is maintained constant at the value of the initial anode voltage $U_{a0}$ of, for example 30% of the nominal anode voltage. This has the advantage that in the modulation range from 0 to $m_0$ no dynamic distortion can occur in consequence of a delayed follow-up of the anode voltage $U_{a1}$ with respect to the modulation signal. The dotted lines parallel to the abscissa in FIG. 3 indicate presettable different initial anode voltage values $U_{a0}$.

Figure 4:
FIG. 4 is an illustration of a rectangular burst signal $U_{mod}$ at the input of the variable-voltage control unit 15 of FIG. 1.
Figure 5:
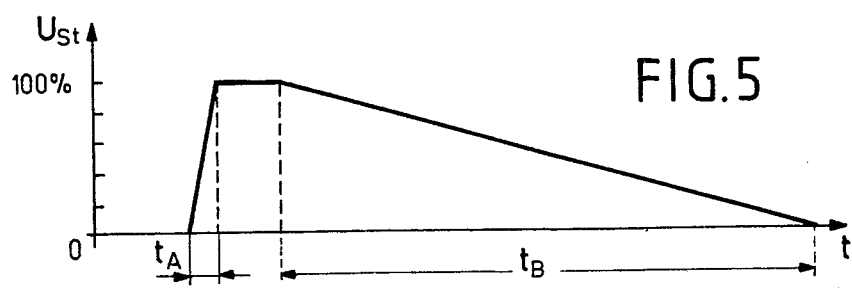
FIG. 5 is a graph illustrating a pulse response signal $U_{St}$ to the rectangular signal according to FIG. 4 at the output of the variable-voltage control unit 15 of FIG. 1.

FIGS. 4 and 5 show the dynamic characteristics of the control stage 15. FIG. 4 represents a rectangular burst signal $U_{mod}$ at the input of this control stage and FIG. 5 a pulse response signal to this rectangular signal at the output of 15. The pulse response signal follow a rise in the input signal delayed within the rise time of $t_A$ and a drop within the decay time $t_B$. The result of such a time characteristic is that after modulation gaps or periods of low modulation the anode voltage rapidly follows an abrupt rise in modulation amplitude and dynamic distortion is kept low.

Modulation of high amplitude following the abrupt rise is amplified practically without distortion since the control voltage $U_{St}$ and thus also the variable anode voltage $U_{a1}$ remain for a certain time at the high potential and decrease only slowly. With this arrangement a certain low power loss is accepted in favor of a comparatively low noise factor. A reduction in the dynamic distortion in the proportional range of the variable anode voltage is achieved by a delay of the modulation signal in the delay section 11 in the feed line to the control grids of the tetrodes 8 and 9. The delay time T is set in such a manner that it is at least approximately equal to the delay of the variable anode voltage $U_{a1}$ with respect to the change in time of the modulation signal $U_{mod}$.

Figure 6:
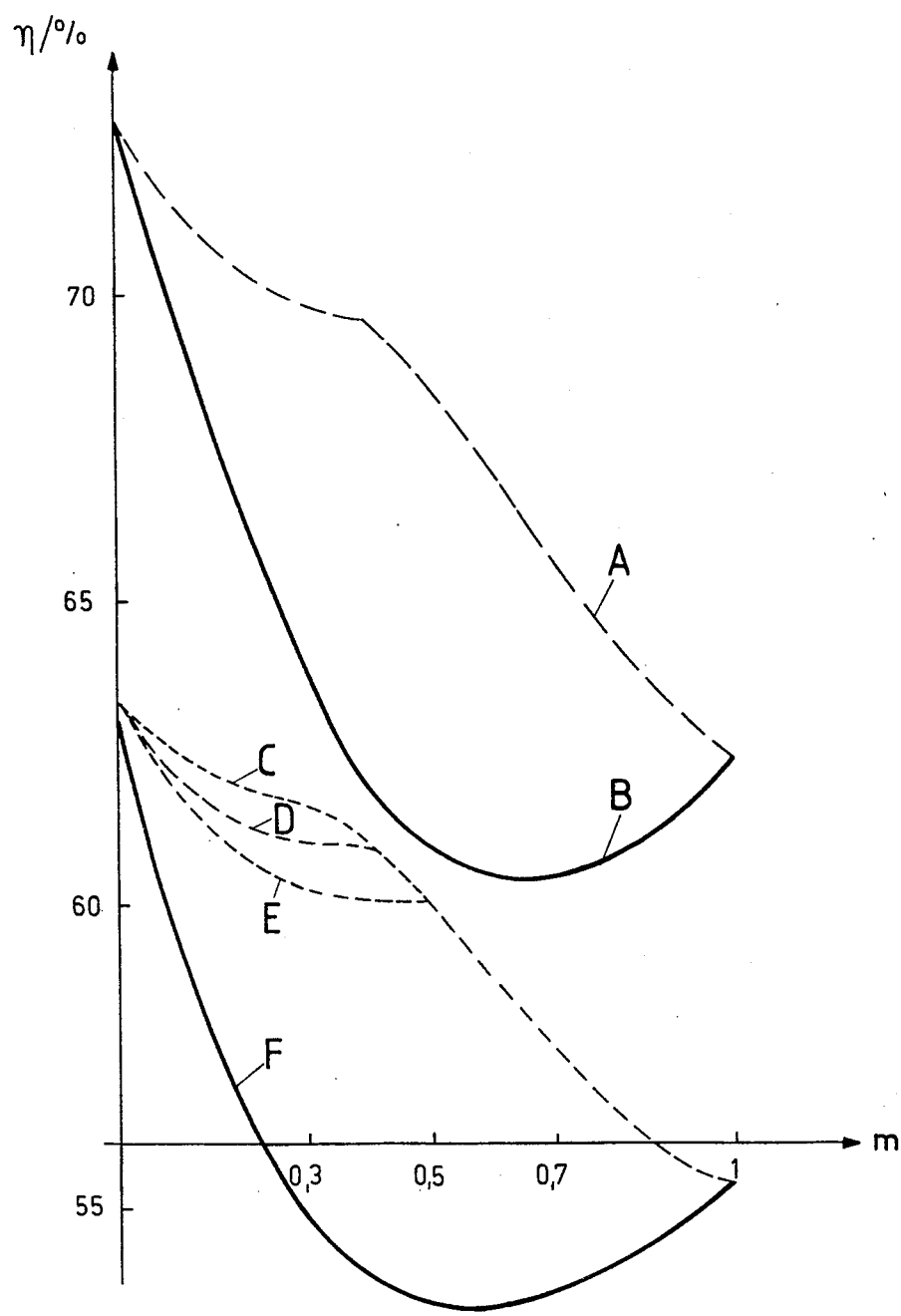
FIG. 6 is a graph illustrating the total efficiencies $\eta$ of transmitters as a function of the modulation factor m for different transmitter powers and different anode voltages of the modulation amplifier.

FIG. 6 shows total efficiencies $\eta$ of two transmitters in class B mode as a function of the modulation factor m. Curves A and B apply to a 600 kW medium-wave transmitter and curves C-F to a 250 kW short-wave transmitter. Curve A shows the improvement of the efficiency with a variable voltage from $m_0=0.4$ in comparison with curve B which applies to operation without varable voltage, that is to say with full nominal voltage and a quiescent anode current of 0.2 A. Curves C, D and E are associated with variable voltages from $m_0=0.3, 0.4$ and 0.5. They show the improvement in the efficiency with respect to curve F which applies to operation at a nominal voltage of 14 kV and a quiescent anode current of 0.3 A (residual anode voltage=1.6 kV). These curves show clearly that especially at medium and low modulation factors to about 0.4, which are typically achieved with program modulation, considerable improvements in efficiency are achievable.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A high power class B modulation amplifier for a broadcast transmitter, comprising:
   first and second high power amplifying means connected for push-pull operation to a primary winding of a modulation transformer;
   preamplifying means for amplifying an incoming audio signal to a level sufficient for controlling the operation of said first and second high power amplifying means;
   a modulator rectifier including at least one controllable rectifier provided for deriving a variable D.C. power supply voltage for said first and second high power amplifying means from an A.C. line voltage;
   a voltage control stage provided for deriving a control signal from said incoming audio signal, said control signal corresponding at least partially to the envelope of said incoming audio signal and following the amplitude of said envelope with a presettable response time; and
   a control device connected to the output of said voltage control stage provided for delivering an output signal to said at least one controllable rectifier in accordance with said control signal, so that said variable D.C. power supply voltage varies in accordance with said control signal.

2. A high power class B modulation amplifier according to claim 1, wherein said first and second high power amplifying means comprise at least first and second high power tetrodes, and wherein said variable D.C. power supply voltage is the anode voltage of said at least first and second high power tetrodes.

3. A high power class B modulation amplifier according to claim 2, wherein said modulator rectifier comprises:
   a thyristor-controlled full wave rectifier bridge, and
   a smoothing capacitor at an output of said rectifier bridge.

4. A high power class B modulation amplifier according to claim 3, wherein said preamplifying means comprises:
   delaying means for delaying said incoming audio signal during its amplification for a delay time which is at least approximately equal to a delay of said variable D.C. power supply voltage with respect to said envelope of said incoming audio signal.

5. A high power class B modulation amplifier according to claim 4, wherein said voltage control stage comprises:
   first and second timing means for respectively providing a first response time of said control signal of approximately 1 ms during a rise of said control signal and a second response time of said control signal in a range of 0.5-10 s during a fall of said control signal.

6. A high power class B modulation amplifier according to claim 5, further comprising:
   means for keeping said variable D.C. power supply voltage at a constant value greater than zero for modulation factors below a presettable value in the range of 0.2 to 0.6; and
   means for varying said variable D.C. power supply voltage in proportion to said modulation factor for modulation factors greater than said presettable value.

* * * * *